US009202979B2

(12) United States Patent
Krishnamoorthy et al.

(10) Patent No.: US 9,202,979 B2
(45) Date of Patent: Dec. 1, 2015

(54) VERTICAL LIGHT EMITTING DIODE WITH PHOTONIC NANOSTRUCTURES AND METHOD OF FABRICATION THEREOF (71) Applicant: Agency for Science, Technology and Research, Singapore (SG)

(72) Inventors: Sivashankar Krishnamoorthy, Singapore (SG); Krishna Kumar Manippady, Singapore (SG); Surani Bin Dolmanan, Singapore (SG); Kaixin Vivian Lin, Singapore (SG); Siew Lang Teo, Singapore (SG); Sudhiranjan Tripathy, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 95 days.

(21) Appl. No.: 14/141,549

(22) Filed: Dec. 27, 2013

(65) Prior Publication Data

US 2014/0183448 A1    Jul. 3, 2014

(30) Foreign Application Priority Data

Dec. 27, 2012  (SG) ............................. 201209579-0

(51) Int. Cl.
  *H01L 21/00*   (2006.01)
  *H01L 33/32*   (2010.01)
  *H01L 33/00*   (2010.01)
  *H01L 33/10*   (2010.01)

(52) U.S. Cl.
  CPC ............ *H01L 33/32* (2013.01); *H01L 33/0095* (2013.01); *H01L 33/10* (2013.01); *H01L 2933/0083* (2013.01)

(58) Field of Classification Search
  CPC . H01L 33/20; H01L 33/06; H01L 2993/0083; H01L 25/167
  See application file for complete search history.

(56) References Cited

U.S. PATENT DOCUMENTS

| 8,723,159 | B2 * | 5/2014 | Zhang et al. ..................... 257/14 |
| 2006/0029792 | A1 * | 2/2006 | Chen et al. .................... 428/323 |
| 2006/0192115 | A1 * | 8/2006 | Thomas et al. ............... 250/306 |
| 2007/0151592 | A1 * | 7/2007 | Forrest et al. ................. 136/243 |
| 2009/0095349 | A1 * | 4/2009 | Forrest et al. ................. 136/262 |

* cited by examiner

*Primary Examiner* — Zandra Smith
*Assistant Examiner* — John M Parker
(74) *Attorney, Agent, or Firm* — Winstead, P.C.

(57) ABSTRACT

There is provided a method of fabricating a vertical light emitting diode which includes forming a light emitting diode structure. Forming the light emitting diode structure includes: forming a first material layer of a first conductivity type, forming a second material layer of a second conductivity type, forming a light emitting layer between the first material layer and the second material layer, and forming a plurality of generally ordered photonic nanostructures at a surface of the first material layer through which light generated from the light emitting layer is emitted for enhancing light extraction efficiency of the vertical light emitting diode. In particular, forming a plurality of generally ordered photonic nanostructures includes forming a self-assembled template including generally ordered nanoparticles on the surface of the first material layer to function as a mask for forming the photonic nanostructures at said surface of the first material layer. There is also provided a vertical light emitting diode with the self-assembly derived ordered nanoparticles.

17 Claims, 9 Drawing Sheets

As-deposited
FIG. 6A

10s etch
FIG. 6B

20s etch
FIG. 6C

FIG. 7A

Spacing, /nm

VERTICAL LIGHT EMITTING DIODE WITH PHOTONIC NANOSTRUCTURES AND METHOD OF FABRICATION THEREOF

FIELD OF INVENTION

The present invention generally relates to a vertical light emitting diode (VLED) with photonic nanostructures for enhancing the light extraction efficiency of the VLED, and a method of fabricating the VLED.

BACKGROUND

To obtain a high brightness and high efficient light emitting diode (LED) for general illumination, it may be desirable to fabricate a vertical light emitting diode (VLED) having a light emitting structure sandwiched between two electrodes. Recently, major LED manufacturers have commercialized VLED chips. The majority of these conventional VLEDs are produced by transferring the LED structure initially formed on a sapphire substrate to a conducting substrate using a laser lift-off process. Some manufacturers have also recently claimed to have achieved white LEDs with luminous efficacy of 150 lm/W (lumens per watt) using vertical LEDs and phosphors. In addition, there have been studies on GaN on silicon which show that vertical LEDs can also be achieved by transferring LED structures grown on bulk silicon (Si) substrates to conducting substrates by wafer bonding or chemical lift-off processes. However, the internal quantum efficiency (IQE) of the LED structure on bulk Si is lower due to the high density of threading dislocations.

Various conventional approaches have been disclosed in an attempt to increase the light extraction efficiency of conventional VLEDs, such as roughening (e.g., by forming photonic crystals) or patterning the top surface of the LED structure. However, a major problem with such conventional approaches relates to chip handling when roughening or patterning the top surface of the LED structure after the layer transfer process (i.e., after the LED structure has been transferred to a conducting substrate). For example, roughening the surface by dry or wet etching using a high temperature deposition process would likely cause cracking of the transferred LED structure due to a vertical stress gradient created by the thermal expansion mismatch between the transferred LED structure and the conducting substrate. In addition, expensive techniques such as electron beam lithography result in a low throughput fabrication process. On the other hand, simple dry etching to roughen the top surface of the LED structure (e.g., by aggressive reactive ion etching or plasma etching) does increase light output but results in poor light extraction efficiency due to the lack of ordering or regularity in the patterns formed on the top surface. For example, the roughened surface may be damaged by the plasma etch and possesses a high density of point defect complexes (such as vacancy-impurity complexes).

Conventionally, GaN-based LED structure formed on a sapphire substrate requires the removal of expensive sapphire substrate through laser lift-off (LLO) in the commercial production of high brightness LEDs. This conventional method is costly as it requires the use of high power lasers and expensive large area sapphire substrates. The sapphire substrate production is also commercially limited to 6 inch wafer size and hence, growth potential to larger substrate sizes is limited. Furthermore, the use and maintenance of high power lasers are complicated and difficult to control resulting in non-uniform yield from wafer to wafer during the laser lift of large diameter wafer. Since sapphire substrates are insulators, heat dissipation is also a major concern for flip-chip LEDs. On the other hand, the growth of GaN-based LED structure on bulk Si or SOI is cost effective and may lead to a higher manufacturing yield. However, the internal quantum efficiency (IQE) of the LED structure on bulk Si is lower due to a higher defect density.

A need therefore exists to provide a vertical light emitting diode (VLED) and a method of fabricating the VLED which seek to overcome, or at least ameliorate, one or more of the above deficiencies associated with the conventional VLEDs, and in particular, to enhance the light extraction efficiency of the VLED. It is against this background that the present invention has been developed.

SUMMARY

According to a first aspect of the present invention, there is provided a method of fabricating a vertical light emitting diode comprising:
  forming a light emitting diode structure including:
    forming a first material layer of a first conductivity type;
    forming a second material layer of a second conductivity type;
    forming a light emitting layer between the first material layer and the second material layer; and
    forming a plurality of generally ordered photonic nanostructures at a surface of the first material layer through which light generated from the light emitting layer is emitted for enhancing light extraction efficiency of the vertical light emitting diode,
  wherein said forming a plurality of generally ordered photonic nanostructures comprises forming a self-assembled template comprising generally ordered nanoparticles on said surface of the first material layer to function as a mask for forming the photonic nanostructures at said surface of the first material layer.

Preferably, said forming a self-assembled template comprises coating a layer on said surface of the first material layer using a solution comprising block copolymer reverse micelles.

Preferably, said forming a self-assembled template further comprises exposing the coated layer to vapors including a precursor for incorporating the precursor within a core of the reverse micelles.

Preferably, the vapors comprise one or more of $SiCl_4$, $TiCl_4$, $HfCl_4$ and $ZrCl_4$ vapors, and the precursor is one or more of corresponding Si, Ti, Hf and Zr, for forming said nanoparticles comprising one or more of corresponding $SiO_2$, $TiO_2$, $HrO_2$, and $ZrO_2$.

Preferably, said forming a self-assembled template further comprises exposing the coated layer to oxygen plasma to remove the block copolymer surrounding the core of the reverse micelles.

Preferably, said forming a plurality of generally ordered photonic nanostructures further comprises applying lithographic pattern transfer using the self-assembled template as the mask for forming the photonic nanostructures in said surface of the first material layer.

Preferably, the lithographic pattern transfer includes etching into the first material layer to form the photonic nanostructures using the self-assembled template as the mask.

Preferably, said forming a light emitting diode structure further comprises forming the light emitting diode structure on a first substrate, and the method further comprises applying a layer transfer process to transfer the light emitting diode structure onto a second substrate to form the vertical light emitting diode.

Preferably, the layer transfer process comprises:
forming the second substrate on the second material layer,
forming a plurality of trenches extending into the first substrate, and
removing the first substrate from the light emitting diode structure via etching, wherein the second substrate comprises a first electrode and a metal substrate formed on the first electrode.

Preferably, the first substrate is selected from a group consisting of a bulk silicon substrate, a silicon on insulator (SOI) substrate, and a sapphire substrate.

Preferably, the method further comprises forming a second electrode on the first material layer, wherein the first and second electrodes are configured to receive a bias voltage for providing power to the light emitting layer to generate light.

Preferably, the second electrode is formed at a surface area of the first material layer without the photonic nanostructures.

Preferably, the first electrode comprises a combination of two or more elements selected from a group consisting of titanium, aluminium, nickel and gold, and the second electrode comprises a combination of two or more elements selected from a group consisting of nickel, gold, silver, and platinum.

Preferably, the light emitting layer comprises one or more quantum wells of indium gallium nitride and gallium nitride (InGaN/GaN) heterostructures.

Preferably, the first material layer comprises an n-type nitride material, and the second material layer comprises a p-type nitride material.

Preferably, the first material is selected from a group consisting of an n-type GaN, an n-type AlGaN, an n-type InAlGaN, and the second material is selected from a group consisting of a p-type GaN, a p-type AlGaN, and a p-type InAlGaN.

Preferably, the photonic nanostructures are generally pillar-type nanostructures.

According to a second aspect of the present invention, there is provided a vertical light emitting diode comprising:
a light emitting diode structure including:
a first material layer of a first conductivity type;
a second material layer of a second conductivity type; and
a light emitting layer disposed in between the first material layer and the second material layer;
wherein a surface of the first material layer has a plurality of generally ordered photonic nanostructures formed thereat using a self-assembled template for enhancing light extraction efficiency of the vertical light emitting diode, the self-assembled template comprising generally ordered nanoparticles on said surface of the first material layer to function as a mask for forming the photonic nanostructures at said surface of the first material layer.

Preferably, the vertical light emitting diode further comprises a first electrode formed on the second material layer, and a second electrode formed on the first material layer, wherein the first and second electrodes are configured to receive a bias voltage for providing power to the light emitting layer to generate light.

Preferably, the first material layer is selected from a group consisting of an n-type GaN, an n-type AlGaN, and an n-type InAlGaN, the second material is selected from a group consisting of a p-type GaN, a p-type AlGaN, and a p-type InAlGaN, and the light emitting layer comprises one or more quantum wells of indium gallium nitride and gallium nitride (InGaN/GaN) heterostructures.

BRIEF DESCRIPTION OF THE DRAWINGS

Embodiments of the present invention will be better understood and readily apparent to one of ordinary skill in the art from the following written description, by way of example only, and in conjunction with the drawings, in which.

DETAILED DESCRIPTION

Embodiments of the present invention seek to provide a vertical light emitting diode (VLED) with photonic nanostructures (or light extraction nanostructures) for enhancing the light extraction efficiency of the VLED, and a method of fabricating the VLED. Details of the VLED and the method of fabricating the VLED according to exemplary embodiments of the present invention will now be described.

Figure 1A:
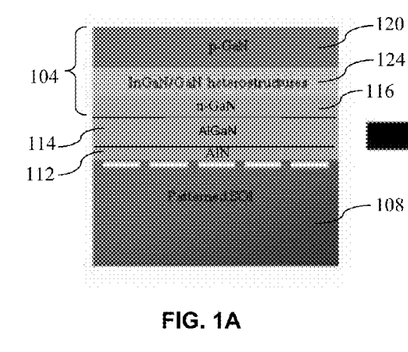
FIG. 1A schematically depicts an exemplary LED structure initially formed on a sacrificial SOI substrate according to an example embodiment of the present invention.
Figure 1B:
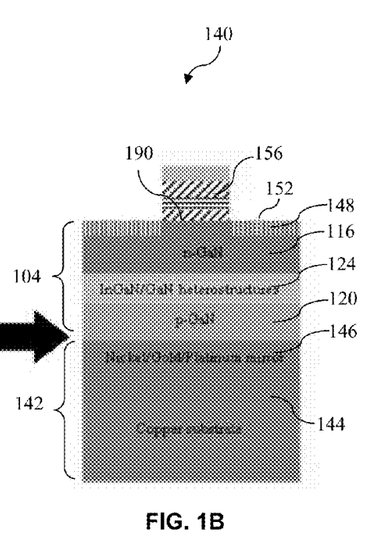
FIG. 1B schematically depicts an exemplary completed VLED formed after the LED structure shown in FIG. 1A has been transferred to a receiving or conducting substrate according to the example embodiment of the present invention.

FIG. 1A schematically depicts an exemplary LED structure 104 initially formed on a sacrificial or growth substrate (first substrate) 108 and FIG. 1B schematically depicts an exemplary completed VLED 140 formed after the LED structure 104 shown in FIG. 1A has been transferred to a receiving or conducting substrate (second substrate) 142 according to an example embodiment of the present invention.

Figure 2:
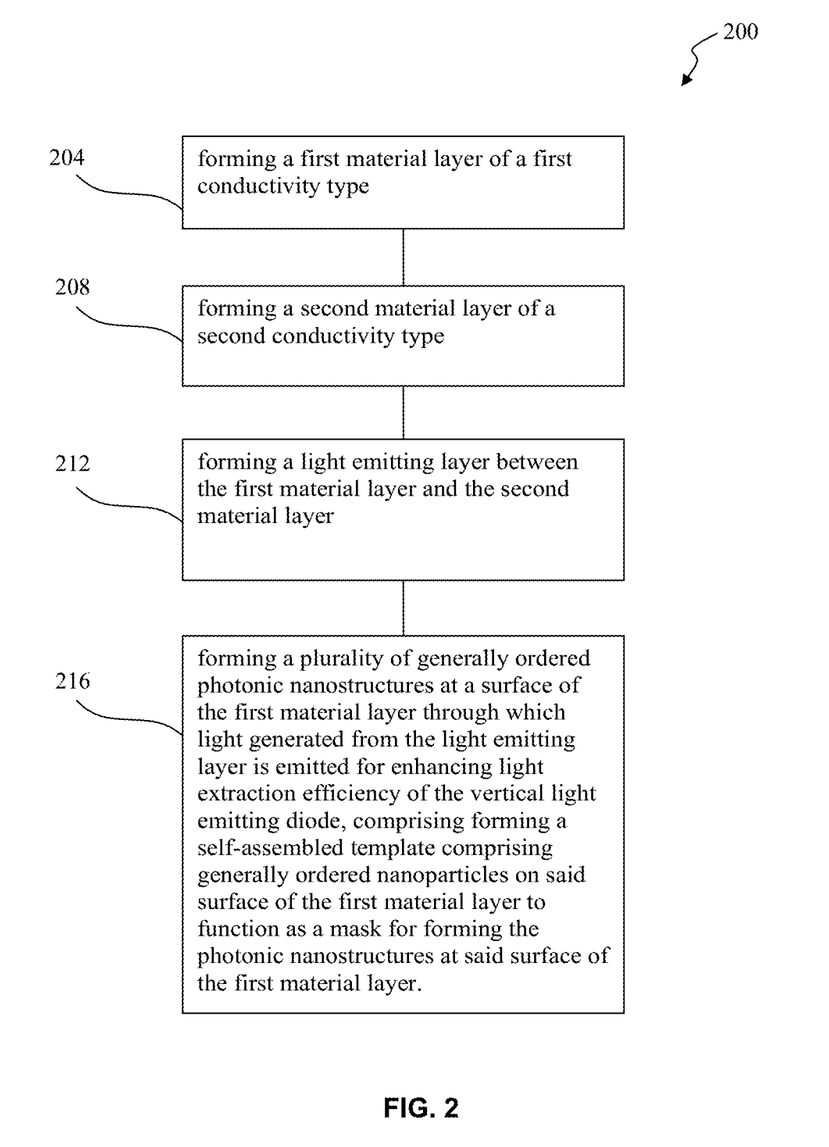
FIG. 2 generally depicts a flow diagram illustrating a method of fabricating the VLED.

FIG. 2 generally depicts a flow diagram illustrating a method 200 of fabricating the VLED 140. The method 200 comprises forming a LED structure 104 which includes a step 204 of forming a first material layer 116 of a first conductivity type (e.g., n-type), a step 208 of forming a second material layer 120 of a second conductivity type (e.g., p-type), and a step 212 of forming a light emitting layer 124 between the first material layer 116 and the second material layer 120. Subsequently, the method 200 further comprises a step 216 of forming a plurality of generally ordered photonic nanostructures 148 (i.e., of nanoscale) at a surface 152 of the first material layer 116 through which light generated from the light emitting layer 124 is emitted for enhancing light extraction efficiency of the VLED 140. In particular, the step 216 of forming the plurality of generally ordered photonic nanostructures 148 comprises forming a self-assembled (SA) template (e.g., layer 416 shown in FIG. 4) comprising generally ordered nanoparticles 408 on the surface 152 of the first material layer 116 to function as a mask for forming the photonic nanostructures 148 at the surface 152 of the first material layer 116. With the generally ordered photonic nanostructures 148 formed at the surface 152 of the first material layer 116 through which light generated from the light emitting layer 124 is emitted, light can be scattered more effectively by the photonic nanostructures 148, thereby enhancing the light extraction efficiency of the VLED 140.

It will be appreciated to a person skilled in the art that the above-described steps may be performed in another order and are not limited to the order presented. Furthermore, the above steps are not intended to be construed to necessitate individual steps and may be combined as one fabrication step where appropriate without deviating from the scope of the present invention.

For clarity and illustration purposes, the above exemplary embodiment will now be described in further details including the specific materials/elements and techniques used to form the VLED 140. Although the specific materials/elements and techniques described hereinafter may be preferred in certain embodiments of the present invention, it will be appreciated to a person skilled in the art that the present invention is not limited as such, and other materials/elements and techniques may be used as appropriate without deviating from the scope of the present invention.

Figure 1C:
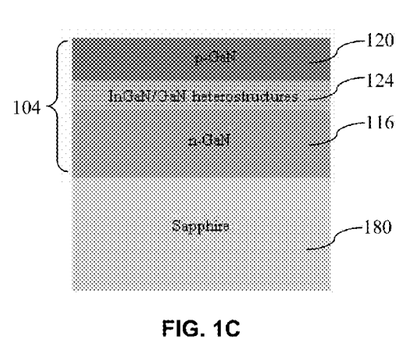
FIG. 1C schematically depicts an exemplary LED structure initially formed on a sapphire substrate according to another example embodiment of the present invention.
Figure 1D:
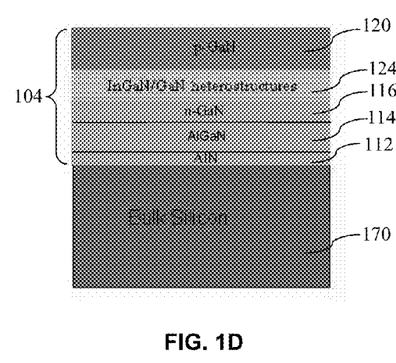
FIG. 1D schematically depicts an exemplary LED structure initially formed on a bulk silicon substrate according to a further example embodiment of the present invention.

In an exemplary embodiment, the LED structure 104 comprises indium gallium nitride/gallium nitride (InGaN/GaN) heterostructures (the light emitting layer) 124 sandwiched between a silicon-doped n-type GaN layer (the first material layer) 116 and a magnesium-doped p-type GaN layer (the second material layer) 120. It will be appreciated to a person skilled in the art that the first and second material layers 120, 124 are not limited to GaN material, and other materials may instead be used as appropriate such as aluminum gallium nitride (AlGaN) or indium aluminum gallium nitride (InAlGaN) quaternary alloys. Accordingly, the LED structure 104 may also be referred to as a multi-layer stack of nitride materials. As shown in FIG. 1A, the LED structure 104 is initially grown on a sacrificial substrate 108. It will be appreciated that growing the LED structure 104 on the sacrificial substrate 108 does not necessarily mean that the LED structure 104 is grown directly on the substrate, and that one or more material layers may be provided in between. In the example embodiment, a buffer layer (e.g., an aluminium nitride (AlN) buffer layer) 112 and an intermediate layer (e.g., an aluminium gallium nitride (AlGaN) layer) 114 may first be grown on the sacrificial substrate 108 before the LED structure 104 is grown on the intermediate layer 114. In preferred embodiments, the sacrificial substrate 108 is a silicon on insulator (SOI) substrate, and more specifically, a patterned SOI substrate or a strain-released GaN on (buried oxide) BOX-patterned SIMOX SOI substrate. It will be appreciated that the present invention is not limited to the sacrificial substrate 108 being a SOI substrate, and other types of substrates may instead be used as appropriate. For example, the LED structure 104 may initially be grown on a bulk silicon substrate 170 as illustrated in FIG. 1C or on a sapphire substrate 180 as illustrated in FIG. 1D. As an example, the bulk silicon substrate 180 or the SOI substrate 108 may comprise (111)-oriented silicon of up to 150 or 200 mm in diameter.

In the example embodiment, to form the VLED 140, the LED structure 104 undergoes a layer transfer process where the sacrificial substrate 108 is completely removed and the LED structure 104 is transferred to a conducting substrate 142, preferably, a metal or metal alloy/stack substrate. As illustrated in FIG. 1B, the metal stack substrate 142 may comprise a copper substrate 144 and a p-type electrode 146 formed on the copper substrate 144. In a preferred embodiment, the p-type electrode 146 comprises a combination of two or more elements selected from a group consisting of nickel, gold, platinum and silver. After the layer transfer process, a plurality of generally ordered photonic nanostructures 148 is formed at the surface 152 of the silicon doped n-type GaN layer 116 using a self-assembled template technique. In a preferred embodiment, the photonic nanostructures 148 are formed in the surface 152 of the silicon doped n-type GaN 116 layer. Subsequently, an n-type electrode 156 is formed on the LED structure 104 (i.e., on the surface 152 of the n-type GaN 116 layer) as shown in FIG. 1B. In a preferred embodiment, the n-type electrode 156 is a metal stack (i.e., multiple metal layers) which comprises a combination of two or more elements selected from a group consisting of titanium, aluminium, nickel and gold.

In the example embodiment, to form the plurality of photonic nanostructures 148 which are generally/highly ordered/periodic at (i.e., in or on) the surface 152 of the LED structure 104, they are formed using a self-assembled template 416 (e.g., see FIG. 4) comprising generally ordered nanoparticles 408 on the surface 152 of the LED structure 104 which acts as a mask for forming the ordered photonic nanostructures 148, for example, by dry etching. In a preferred embodiment, the self-assembled template 416 is a layer coated on the surface 152 of the LED structure 104 using a solution comprising block copolymer reverse micelles 408. The photonic nanostructures 148 formed at the surface 152 preferably are generally pillar-type nanostructures. Furthermore, the fabrication conditions can be controlled to achieve a desired height and spacing of the nanostructures 148 and examples will be described later.

The p-type electrode 146 to the p-type GaN layer 120 and the n-type electrode 156 to the n-type GaN layer 116 are used for electrical connection to drive the VLED 104 at different injection current. In particular, a bias voltage may be applied across the p-type GaN layer 120 and the n-type GaN layer 116 for providing power to the light emitting layer 124 to generate light. The light generated by the light emitting layer 124 is emitted through the n-GaN layer 116 and scattered more effectively by the photonic nanostructures 148 at the surface 152 of the n-GaN layer 116. In particular, the photonic nanostructures 148 formed by the self-assembled template 416 have been found to significantly enhance the light extraction efficiency of the VLED 104 due to the generally ordered nature of the photonic nanostructures 148. Therefore, advantageously, the light output power of the VLED 140 with the generally ordered photonic nanostructures 148 can deliver higher luminance efficacy as compared to conventional VLEDs without photonic nanostructures or with irregular/non-ordered photonic nanostructures.

The method of fabricating the n-side-up GaN-based VLED 140 will now be described in further detail according to an exemplary embodiment of the present invention with reference to FIGS. 3A to 3D. As a first step, the LED structure 104 is formed on a sacrificial or growth substrate 108 such as a patterned SOI or a bulk silicon substrate as show in FIG. 3A. For example, the LED structure 104 may be grown on the sacrificial substrate 108 by metal organic chemical vapor deposition (MOCVD). In the case of a patterned SIMOX SOI substrate 108, the thickness of the Si overlayer 302 of the SOI substrate 108 may preferably be in the range of about 10 nm to about 300 nm with a buried oxide (BOX) 304 thickness being in the range of about 60 nm to about 500 nm. The patterned SIMOX SOI substrate 108 can also be created by using a thick micro or nano-patterned $SiO_2$ mask during the SIMOX process. After thermal annealing and removal of the top oxide layer, a BOX-patterned (111)-oriented SIMOX SOI substrate 108 is formed. The epitaxial process of depositing nitrides may then start with a high temperature growth of the AlN buffer 112 at temperature of 1050° C. or higher, and then followed by the growth of the AlGaN intermediate layer 114. For example, an AlN buffer layer 112 having a thickness of 200 nm or higher may be grown at temperature in the range of about 1050° C. to 1075° C. The thickness of the AlN buffer layer 112 is preferably about 300 nm to about 350 nm when the thickness of the SOI overlayer 302 is about 100 nm or less. The AlGaN intermediate layer 114 may be grown at temperature in the range of 1040° C. to about 1060° C. with an average temperature profile of 1050° C. In an embodiment, the target thickness of the intermediate layer is determined based on the selective Al content, preferably, linearly graded 55% to 25% Al composition in the intermediate layer 114. For simplicity, in FIGS. 3A to 3C, the AlN buffer layer 112, the AlGaN intermediate layer 114 and the n-GaN layer 116 may be schematically depicted together as nGaN on AlGaN/AlN buffer. The LED structure 104 is then grown on the intermediate layer 114 by MOCVD. For example, a silicon doped n-type nitride layer (e.g., n-GaN) 116 is formed on the intermediate layer 114, followed by forming an In-alloyed nitride and nitride material (InGaN/GaN) multiple quantum wells (MQW) or heterostructure (light emitting layer) 124 on the n-type nitride layer 116 (e.g., formed at temperature in the range of about 780° C.-800° C.), and then forming a magnesium doped p-type nitride layer (e.g., p-GaN) 120 on the light emitting layer 124 (e.g., formed at temperature in the range of about 900° C.-920° C.).

Figure 3A:
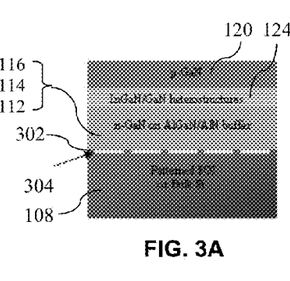
FIGS. 3A to 3D schematically depict the steps involved in fabricating the VLED up to the completion of the layer transfer process according to an embodiment of the present invention.
Figure 3B:
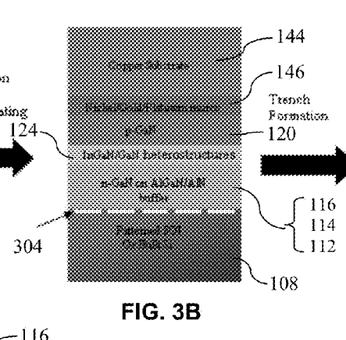

After the growth of the LED structure 104 on the SOI substrate 108, a p-type metal electrode (or reflecting mirror) 146 is formed on the p-GaN layer 120 as illustrated in FIG. 3B by electron-beam evaporation. For example, the p-type metal electrode 146 may comprise a combination of a nickel (Ni) layer of 3-5 nm, a gold (Au) layer of 3-5 nm, and a platinum (Pt) layer of 100-200 nm. In embodiments, further elements/layers such as silver (Ag), palladium (Pd) and/or ruthenium (Ru) may also be included in the combination. In an embodiment, a conductive seed layer made of Ni (not shown) is then electroplated on the p-type metal electrode 146 for allowing thick copper electroplating. Subsequently, a metal substrate (preferably copper substrate) 144 which has high thermal conductivity having a thickness of 150 μm or higher is electroplated or electroless deposited on the p-type metal electrode 146. In the example embodiment, the p-type electrode layer 146 is subjected to a thermal annealing process prior to the layer transfer from the SOI substrate 108, for example, in the temperature range of 400° C. to 700° C. The p-type metal electrode 146 and the metal substrate 144 together form the conducting substrate 142.

Figure 3C:
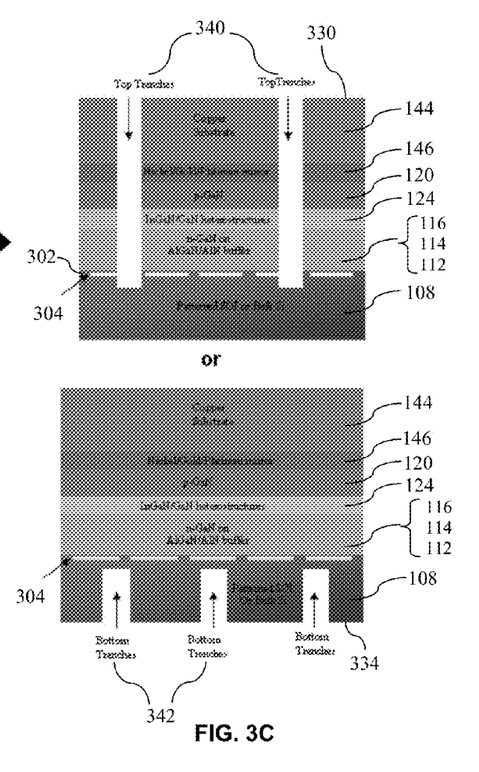

The LED structure 104 grown on the SOI substrate 108 then undergoes a layer transfer process to the conducting substrate 142 to produce the GaN-based VLED 140. In particular, the layer transfer process comprises forming a plurality of trenches 340 or 342 extending into the sacrificial SOI substrate 108. As illustrated in FIG. 3C, top trenches 340 may be formed which extends from a top side 330 of the LED structure 104, through the LED structure 104, and partially into the SOI substrate 108. Alternatively, bottom trenches 342 may be formed which extends from a bottom side 334 of the LED structure 104 and partially into the SOI substrate 108. In both cases, the trenches 340, 342 formed terminate in the Si handle 312 of SOI substrate 108. These trenches 340 or 342 may be formed using dry etching by selectively coating the surface in which the trenches are to be formed with photoresist, that is, by selective patterning and etching of the surface in which the trenches are to be formed. It will be appreciated that the trenches 340, 342 may be formed by various other techniques such as by a laser based scribing process or by a sawing process (e.g., sawing of grooves by shallow scribing with a diamond sawing tool). A metal deposition is then carried out through the exposed trenches 340, 342.

Figure 3D:
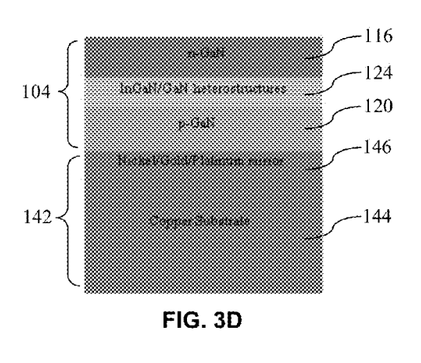

With the trenches 340, 342 formed, the sacrificial SOI substrate 108 can then be removed. The substrate removal process may include chemical or dry etching of the Si handle 312 and SOI layer 108. This is followed by selective dry etching using fluorine ($XeF_2$) gas to remove the entire Si handle 312, thus leaving behind the LED structure 104 on top of the conducting substrate 142. The AlN buffer layer 112 is exposed upon substrate removal. The exposed aluminum nitride (AlN) buffer layer 112 and aluminum gallium nitride (AlGaN) interlayer 114 are then subjected to an inductively coupled plasma (ICP) dry etching process with $BCl_3/Cl_2$ chemistry to remove such layers to complete the layer transfer process. In particular, all the resistive buffer layer 112 and interlayer 114 are etched to expose the silicon-doped n-type nitride layer 116 as shown in FIG. 3D. The LED layers are thus thinned down to a thickness of less than 1 μm in the example embodiment. For example, the thickness of such thin film vertical device may be 600 to 700 nm depending on the desired emission in the blue-green spectral regions.

In an embodiment, if the LED structure 104 is initially formed on a sapphire substrate 180, the sapphire substrate 180 is instead removed by a laser lift-off (LLO) technique.

Next, after the layer transfer process, photonic nanostructures 148 are formed at the top side 152 of the n-type GaN layer 148 by selective masking and etching. As described hereinbefore, the photonic nanostructures 148 are formed by a self-assembled template technique involving lithographic pattern transfer of spherical reverse micelles of block copolymer (i.e., nanoparticles) 408 to create ordered or periodic patterns at the top surface 152 of the n-type GaN layer 148.

Figure 4:
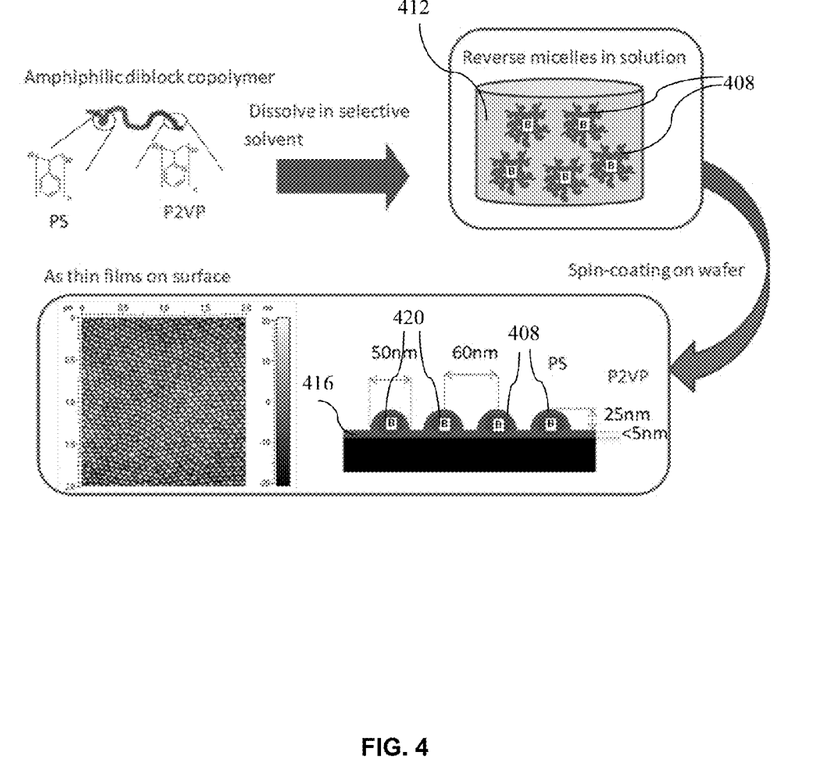
FIG. 4 schematically depicts the reverse micelles of block copolymers used to form the self-assembled template.
Figure 5A:
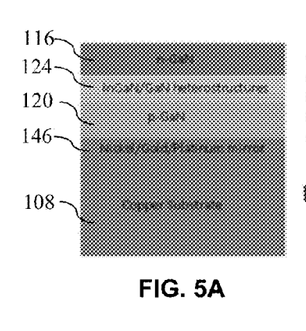
FIGS. 5A to 5E schematically depict the steps involved in fabricating the VLED after the layer transfer process according to an embodiment of the present invention.
Figure 5B:
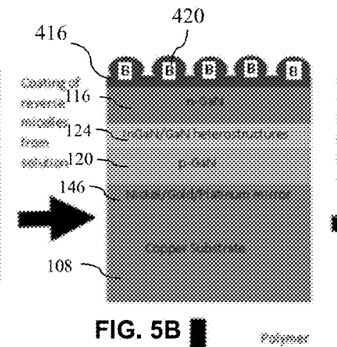
Figure 5C:
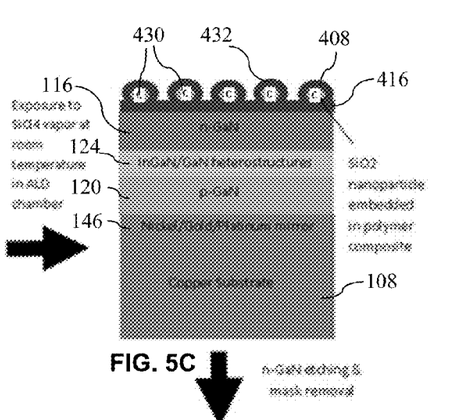

The self-assembled template 416 will now be described in further detail according to an example embodiment of the present invention with reference to FIGS. 4 and 5. In an example embodiment, the block copolymers 408 are polystyrene-block-poly (2-vinylpyridine) (PS-b-PVP) as illustrated in FIG. 4. Reverse micelles 408 of PS-b-PVP (e.g., Mw:

40-b-40.5 kg/mol, PDI: 1.1) were coated from a solution 412 of m-Xylene at about 1% w/w concentration to yield a thin film 416 of quasi-hexagonally ordered 2D array of nanoparticles 408 exhibiting a mean topography of about 25 nm, lateral feature size of about 50 nm and mean spacing of about 60 nm as illustrated in FIGS. 4 and 5B. This thin film 416 constitutes the self-assembled template formed on the surface 152 of the n-type GaN layer 116. The 2D array of nanoparticles 408 is polycrystalline in nature, and consists of highly/generally ordered domains within areas spanning about 0.5-1 µm². As shown in FIG. 5C, the as-coated thin film 416 may then be exposed preferably to $SiCl_4$ or $TiCl_4$ vapors at room temperature within an atomic layer deposition (ALD) chamber to incorporate Si or Ti precursor within the core 420 of the reverse micelles 408. In other embodiments, other vapours may be used such as $HfCl_4$ or $ZrCl_4$ or their mixtures for incorporating Hf and/or Zr precursors within the core 420 of the reverse micelles 408. The $SiCl_4$ vapors selectively decompose within the hydrophilic PVP core 420 of the reverse micelles 408 to form silicon dioxide 430, thereby forming reverse micelles 408 with embedded silicon dioxide nanoparticles 430. After this vapour exposure, the polymer self-assembled template 416 remaining is now more resist to pattern transfer by lithography due to the presence of silicon dioxide 430 as well as the highly cross-linked PVP core. The mean topography of the reverse micelles 408 increases to 40 nm after the vapour exposure and the resultant self-assembled composite template 416 may then be used as a mask for the lithographic pattern transfer of the nanoparticles 408 by dry etching using chlorine plasma into the underlying n-GaN layer 116 to form the ordered photonic nanostructures 148 in the top surface 152 of the LED structure 104 (i.e., top surface of the n-GaN layer 116). In another embodiment, instead of etching, ordered photonic nanostructures 148 may be selectively grown on the top surface of n-GaN layer 116 using the self-assembled template 416. Subsequently, the self-assembled template 416 is removed by being treated with, for example, buffered hydrofluoric acid (BHF) which also removes any silicon dioxide 430 residue that remains.

Figure 5D:
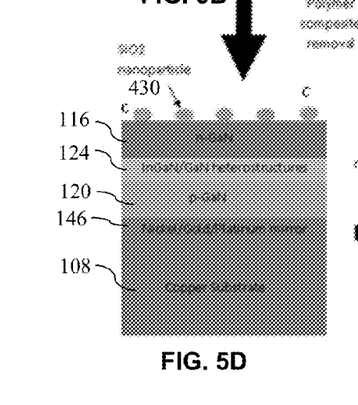
Figure 5E:
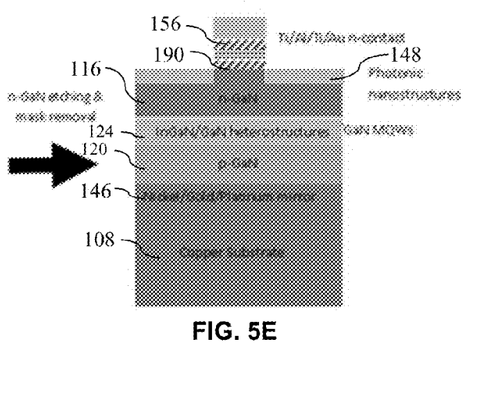

In the example embodiment, the reverse micelle monolayer coated layer 416 is exposed to $SiCl_4$ vapors of highly controlled concentrations within a vacuum chamber. The $SiCl_4$ decomposes selectively within the core 420 of the reverse micelles 408 to form an inorganic nanocomposite with the PVP as shown in FIGS. 4 and 5C. This cross-links the PVP domains and makes the self-assembled template 416 more robust than a polymer template for the lithographic pattern transfer. In an embodiment, as shown in FIG. 5D, the polymer 432 may be removed by oxygen plasma to expose the silicon dioxide nanoparticles 430 that can subsequently be used for the lithographic pattern transfer. This results in smaller nanoparticles 430 on the surface of the n-GaN layer 116.

Advantageously, the above-described technique in the example embodiment involves a soft lithography process which does not disturb the contact electrical parameters of the VLED 140 and does not subject the transferred LED structure 104 on the conducting substrate host 142 to strain/stress sufficient to cause cracking of the transferred LED structure 104. The post process etching on the n-GaN layer 116 may lead to a slight blue shifted emission profile from VLED 140 depending on etch depth, which is due to phase shift if residual oxide coverage remains on the n-GaN surface 152. As long as the contact pads 156 on the n-GaN layer 116 are directly placed on the surface 152 of the n-GaN layer 116, the residual dielectric of $SiO_2$ or $TiO_2$ further helps to extract light from active layers due to a refractive index contrast of unexposed n-GaN regions. Furthermore, since a soft lithography process is used in the example embodiment, it does not require any aggressive plasma exposure of the n-GaN layer 116 that would undesirably lead to an increase in top metal resistance. The periodic etched nanostructures 148 in the n-GaN layer 116 both laterally and depth wise can be controlled by the self-assembly process. The nanostructure dimensions can be further tuned to suit applications in blue or green VLED based on wavelength of emission profiles. By way of examples only, for a blue VLED, the nanostructures 148 may be pillar-type nanostructures with pillar diameter in the range of 30 to 100 nm, while for a green LED, a wider pillar diameter in the range of 50 to 150 nm may be preferred. The mean spacing of the nanostructures 148 may also be configured to range from, but not limited to, 40 nm to 100 nm as appropriate.

Figure 6A:
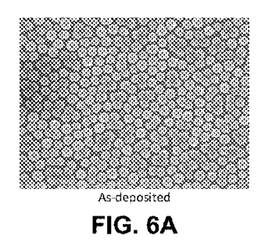
FIGS. 6A to 6C depict SEM images of the nanostructures formed at various ICP etching intervals.
Figure 6B:
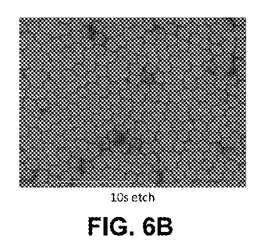
Figure 6C:
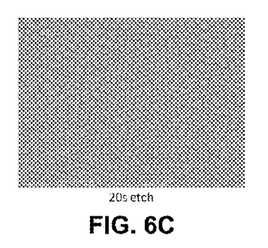

The fabrication conditions can be controlled to achieve a desired size (e.g., height and width) and spacing of the nanostructures 148. For example, in the case of forming the nanostructures 148 via dry etching, various etching conditions (such as etching period and amount of gas flow) can be controlled to produce the desired size and spacing of the nanostructures 148 as illustrated in FIGS. 6A to 6C. The etch depth of nanostructures 148 may be chosen for efficient light extraction from vertical LED chips. In an embodiment, the thickness of the silicon-doped n-type nitride layer 116 is chosen to maximize the light extraction from the underlying multiple quantum wells or heterostructure(s) 124. The periodic nanostructures/patterns 148 shape and size can be controlled by varying the self-assembly process parameters for controlling the shape and size of the nanoparticles 408/430 formed on the GaN layer 116 which act as a mask for forming the nanostructures 148. For example, it is possible to form pyramidal shape GaN nanostructures 148 or inverted-cone shaped nanoholes via etching by increasing the plasma exposure time. In one example, the etch depth can go deeper beyond 100 nm to form the nanostructures 148 by setting the plasma exposure time to about 30 to 40 seconds. Since the pyramidal shape nanostructures 148 lead to improved intensity compared to shallow etched nanohole array, to maximize the light extraction in a preferred embodiment, multiple intervals/loops (preferably two to three) of ICP etching steps are performed when the etch depth requirement is higher than 100 nm. In this case of self assembly, nanopillar-like structures/patterns 148 with faceted interfaces in n-GaN have been found to improve the EL intensity by more than two-fold. The SEM images of the GaN surface 152 at different ICP etching intervals/loops are shown in FIGS. 6A to 6C, with FIG. 6B showing the result of a 10 seconds etching period and FIG. 6C showing the result of a 20 second etching period. Therefore, it is demonstrated that the periodicity and etched nanostructure size/shape can be controlled by adjusting various fabrication conditions.

Figure 7A:
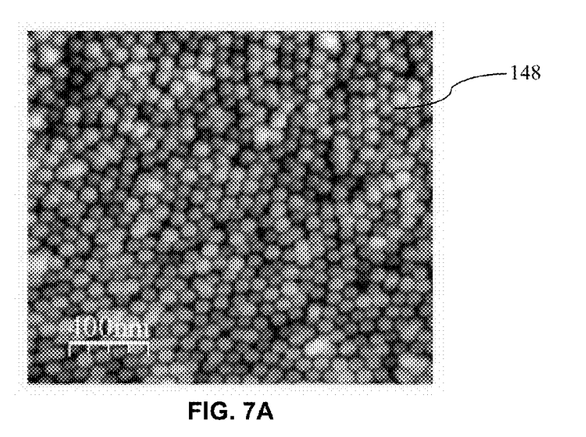
FIG. 7A depicts an image of the nanostructures obtained using atomic force microscopy (AFM) in an example according to the present invention.
Figure 7B:
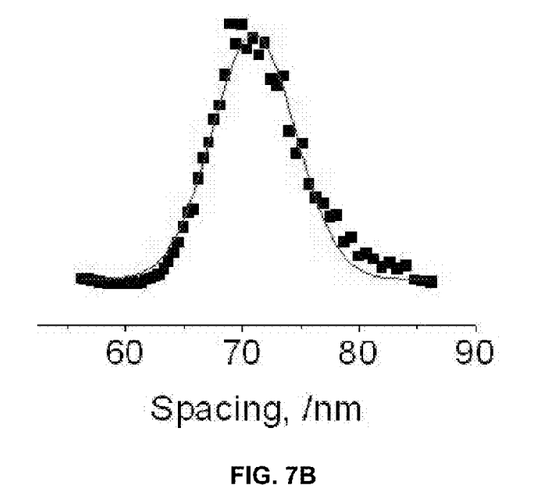
FIG. 7B depicts a histogram in the average spacing of the nanostructure array obtained from the 2D power spectral density of the AFM image in FIG. 7A.

FIG. 7A shows an image of the nanostructures 148 obtained in an example using atomic force microscopy (AFM) to determine the mean topography and to assess the pattern fidelity of the nanostructures 148 produced by dry etching. In this example, the etching was performed using inductively coupled plasma (ICP) etching of the GaN surface 152 using $BCl_3/Cl_2$ gas chemistry. The ICP etching duration can be varied to generate shallow and deeper etched nanostructures/nanopatterns 148. By tuning the size of the nanoparticles 408/430 formed on the GaN layer 116 by the self assembly process, the periodicity of the photonic nanostructured lattice with various size and shape of nano-patterns 148 can be formed as desired. It can be seen from the AFM image shown in FIG. 7A that nanostructures formed 148 are generally well-isolated from each other. FIG. 7B depicts a histogram in the average spacing of the nanostructure array obtained from the 2D power spectral density of the AFM image. The distribution or spacing of the nanostructures 148 was found to match well with the original pattern of reverse micelles 408 previously disposed on the surface 152 of the n-GaN layer 116. FIG. 7B also illustrates the narrow distribution in spacing of about 5% of the mean value, thus demonstrating that the nanostructures are generally evenly spaced.

Figure 8A:
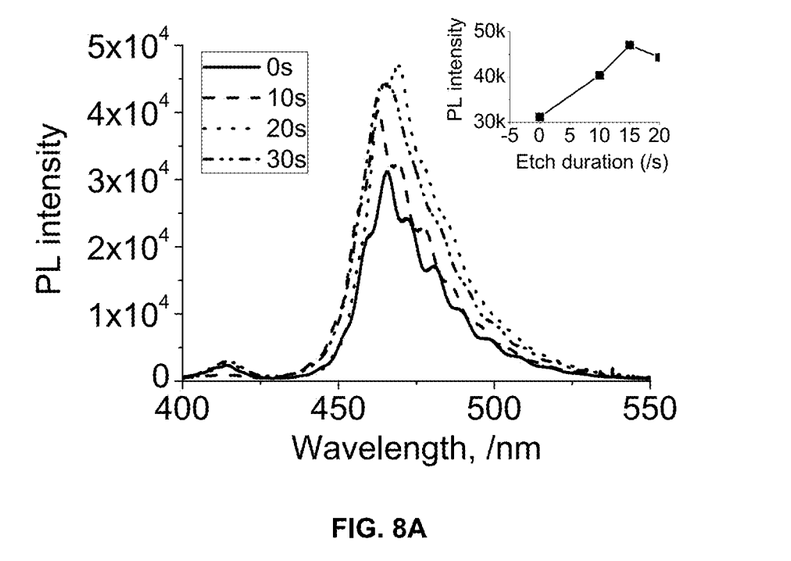
FIG. 8A depicts the photoluminescence characteristics of the VLED with the surface of the GaN layer subjected to ICP etching at different plasma etching duration to form the nanostructures.
Figure 8B:
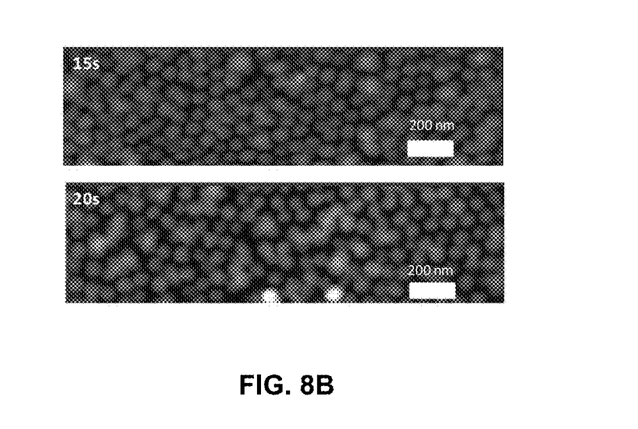
FIG. 8B depicts AFM images of the nanostructures formed by etching durations of 15 and 20 seconds, respectively.
Figure 8C:
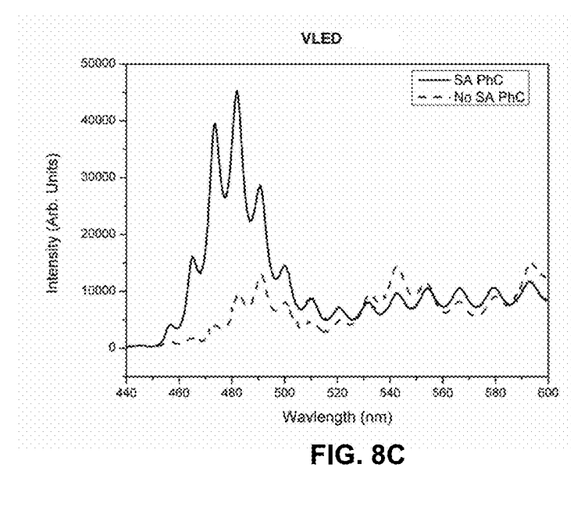
FIG. 8C illustrates the PL spectrums of a conventional VLED and an example VLED having self-assembly derived ordered nanostructures according to the present invention.

FIG. 8A represents typical photoluminescence characteristics of the VLED 140 with the surface 152 of the GaN layer 116 subjected to ICP etching at different plasma etching duration. The GaN layer 116 was etched for different durations (0, 10, 15 and 20 seconds), of which the 15 seconds exhibited the maximum photoluminescence. A possible explanation for the lower photoluminescence associated with the longer exposure time of 20 s is that the longer exposure leads to plasma-induced damage and reduces emission intensity. The corresponding etched patterns/nanostructures 148 can be observed and studied by AFM as shown in FIG. 8B for producing nanopatterned GaN surfaces that helps to improve light extraction. The PL spectrum shown in FIG. 8A is not a direct measure of light output from lateral LED where emission comes from top p-GaN layer. Therefore, the etched patterns/nanostructures are formed on the VLED to demonstrate the improved light emission. FIG. 8C shows a PL spectrum from n-side up vertical LED chip with 325 nm excitation where the chip was processed from LED layers grown on SOI substrate. Due to probing depth limitation, only the weak PL could be extracted from the top quantum wells where yellow luminescence from n-GaN is dominant in the etched GaN for thin film vertical chip. However, etching the n-GaN layer 116 with the self-assembled template features 416 according to embodiments of the present invention, a four-fold increase in PL emission could be observed in FIG. 8C. This shows useful light extraction from active layers 124 with selective etched patterns and demonstrates the significantly enhanced light outcoupling in the VLED 140 with photonic nanostructures 148.

Figure 9A:
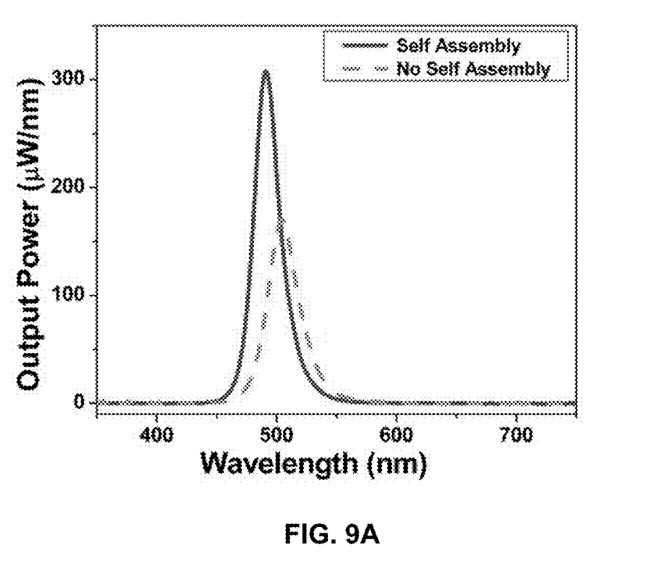
FIG. 9A illustrates the electroluminescence (EL) of a conventional VLED and an example VLED according to the present invention driven at 20 mA.

After the photonic nanostructures 148 were formed on the surface of the n-type GaN layer 116, patterned n-electrode metals 156 were deposited. The n-type contact 156 on the vertical LED device 140 comprises a combination of Ti/Al/Ti/Au or Ti/Al/Ni/Au or Cr/Ni/Au layers of different thicknesses. For example, in the case of Ti/Al/Ti/Au, the thicknesses of Ti, Al, Ti, and Au may be 10 nm, 150 nm, 15 nm and 500 nm, respectively. The top n-electrode layer 156 is terminated with thick Au to wire bond the VLED 140. In an experiment, two types of samples were fabricated, in particular, samples with and without self-assembled $TiO_2$ nanoparticles 430 on the top surface of n-GaN layer 116. The electroluminescence (EL) spectra recorded from a vertical LED chip driven at 20 mA level with chip emission profile is shown in FIG. 9A. The LED is made from epitaxial GaN—SOI epitaxy.

| Vertical LED Samples | Current (mA) | Voltage (V) | Power (mW) | Power output normalization extraction projection |
|---|---|---|---|---|
| Without photonic nanostructures | 20 | 3.27 | 0.60 | Unity value for input/output power |
| With photonic nanostructures | 20 | 3.71 | 1.09 | 1.6 increased output: 60% light extraction |

The I-V characteristic of the VLED 140 formed by self-assembled $TiO_2$ nanoparticles 430 showed higher voltage at 20 mA. This can be attributed to the presence of $TiO_2$ nanoparticles that is sandwiched between the n-GaN layer 116 and the n-contact metal layer 156 as the $TiO_2$ nanoparticles 430 were blanket deposited/formed throughout the surface 152 of the n-GaN layer 116 without prior patterning of the n-contact 156. In an embodiment, to resolve this issue of higher voltage, the n-contact area was patterned first before $TiO_2$ nanoparticles 430 formation so that $TiO_2$ nanoparticles 430 are only formed on the open n-GaN area. Thus, the n-contact probe area 190 is not deposited/formed with $TiO_2$ nanoparticles 430 and the n-contact 156 can form a good ohmic contact with the n-GaN layer 116. With the use of copper substrate 144, the thermal dissipation from the LED structure 104 is more efficient due to closer proximity of InGaN/GaN MQWs to the copper substrate 144.

Figure 9B:
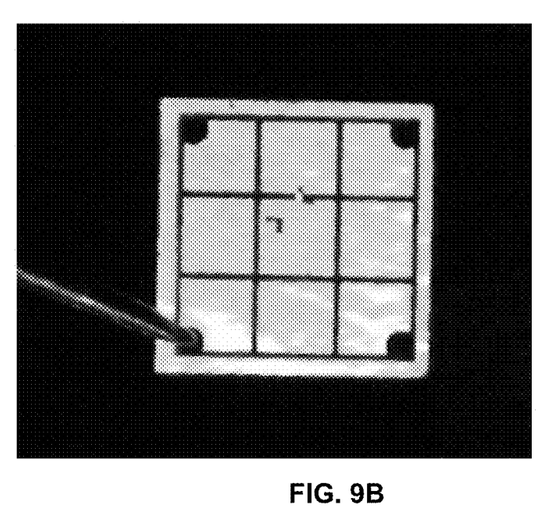
FIG. 9B illustrates current spreading in an example VLED according to the present invention driven at 2 mA.

FIG. 9B shows the probing of an example VLED according to the present invention at 2 mA forward current and demonstrates the excellent current spreading in the VLED 140.

Accordingly, example embodiments of the present invention provide a VLED 140 having photonic nanostructures 148 which significantly enhances the light extraction efficiency of VLED 140. An important aspect of the present invention is the creation of the photonic nanostructures 148 using the above-described self assembly process followed by etching of the n-GaN layer 116 to form the generally ordered photonic nanostructures 148. A bias voltage is applied across the p-GaN layer 120 and the n-GaN layer 116 generating light that is emitted through the n-GaN layer 116 and scattered more effectively by the generally ordered photonic nanostructures 148 (e.g., etched directly into the n-GaN layer 116), thereby enhancing the light extraction efficiency of LED. Formation of the photonic nanostructures 148 with exposed top etched n-type surface with very thin nanometer scale dielectric template/masks like $SiO_2$ or $TiO_2$ helps to extract emissions due to increase in light escape cone coupled with refractive index contrast tuning by any residual dielectric presence. In the example embodiments, the formation of such $TiO_2$ or $SiO_2$ nanoparticles 430 by self assembly process on vertical InGaN/GaN LED chips on copper substrate was applied and dry etched photonics nanostructures 148 created by self assembly led to high brightness LEDs originating from epitaxy of GaN on SOI and bulk Si substrates 108.

Embodiments of the present invention provide a soft-lithography process based on self-assembly to form the photonic nanostructures 148 helps to increase light output power of vertical LEDs. For example, the process is suitable to pattern large area GaN films at a low cost approach compared to electron beam lithography or nanoimprinting. Due to metal substrate host, the GaN layers are not able to withstand any high temperature processing steps to avoid thermal expansion mismatch between the GaN layers and the copper/metal alloys. In such a scenario, usage of PECVD dielectric patterns leads to complexity and therefore an ALD treatment of patterns at room temperature helps to overcome issues related to bowing or cracking of the LED active layers on metal substrate host.

The VLED 140 according to embodiment(s) of the present invention possesses a number of advantages including one or more of the following:

It produces high quality GaN film which are crack free with low defect density (achieved dislocation density on 6 inch growth mode for blue LEDs<$10^9$ cm$^{-2}$) as compared to bulk silicon;

It can be grown on a wide area SOI substrate and it is relatively compatible to silicon processing which allows it to be fabricated of vertical LEDs using current silicon processing tools;

Enhanced light extraction by incorporation of photonic nanostructures using a self assembly process which does not require any aggressive or high temperature process steps for LED layers cited on metal substrates. Accordingly, fabrication and production cost of GaN vertical LEDs can be minimized by realizing compatibility to silicon processing; and The nanostructures on vertical LED chips are created using a unique self assembly followed by Atomic Layer Deposition (ALD) treatments which allow the formation of the $SiO_2$ or $TiO_2$ nanoparticles on n-side up GaN device layers. The nanoparticles act as a mask on large area GaN surface which can be subjected to mild inductively coupled plasma (ICP) etching to form pillar style GaN nanostructures/nanopatterns, and such nanostructures help to improve light output power of the LEDs.

Accordingly, embodiments of the present invention provide a simple but yet effective solution to fabricate generally ordered photonic structured vertical light emitting diode by, for example, using electroluminescent InGaN/GaN LED material grown on thin and large area SOI or bulk substrates. The formation of vertical LEDs on copper substrates is relatively compatible to silicon processing tools and by incorporating 2-D photonic nanostructures using the cost-effective process described herein, the light output power can be significantly increased. This would minimise the costs of making vertical thin film LEDs and thus enables high throughput production of VLEDs for the general illumination market to be realized using GaN on silicon approach.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

The invention claimed is:

1. A method of fabricating a vertical light emitting diode comprising:
    forming a light emitting diode structure including:
        forming a first material layer of a first conductivity type;
        forming a second material layer of a second conductivity type;
        forming a light emitting layer between the first material layer and the second material layer; and
        forming a plurality of generally ordered photonic nanostructures at a surface of the first material layer through which light generated from the light emitting layer is emitted for enhancing light extraction efficiency of the vertical light emitting diode,
    wherein said forming a plurality of generally ordered photonic nanostructures comprises forming a self-assembled template comprising generally ordered nanoparticles on said surface of the first material layer to function as a mask for forming the photonic nanostructures at said surface of the first material layer.

2. The method according to claim 1, wherein said forming a self-assembled template comprises coating a layer on said surface of the first material layer using a solution comprising block copolymer reverse micelles.

3. The method according to claim 2, wherein said forming a self-assembled template further comprises exposing the coated layer to vapors including a precursor for incorporating the precursor within a core of the reverse micelles.

4. The method according to claim 3, wherein the vapors comprise one or more of $SiCl_4$, $TiCl_4$, $HfCl_4$ and $ZrCl_4$ vapors, and the precursor is one or more of corresponding Si, Ti, Hf and Zr, for forming said nanoparticles comprising one or more of corresponding $SiO_2$, $TiO_2$, $HrO_2$, and $ZrO_2$.

5. The method according to claim 3, wherein said forming a self-assembled template further comprises exposing the coated layer to oxygen plasma to remove the block copolymer surrounding the core of the reverse micelles.

6. The method according to claim 1, wherein said forming a plurality of generally ordered photonic nanostructures further comprises applying lithographic pattern transfer using the self-assembled template as the mask for forming the photonic nanostructures in said surface of the first material layer.

7. The method according to claim 6, wherein the lithographic pattern transfer includes etching into the first material layer to form the photonic nanostructures using the self-assembled template as the mask.

8. The method according to claim 1, wherein said forming a light emitting diode structure further comprises forming the light emitting diode structure on a first substrate, and
    the method further comprises applying a layer transfer process to transfer the light emitting diode structure onto a second substrate to form the vertical light emitting diode.

9. The method according to claim 8, wherein the layer transfer process comprises:
    forming the second substrate on the second material layer,
    forming a plurality of trenches extending into the first substrate, and
    removing the first substrate from the light emitting diode structure via etching, wherein the second substrate comprises a first electrode and a metal substrate formed on the first electrode.

10. The method according to claim 8, wherein the first substrate is selected from a group consisting of a bulk silicon substrate, a silicon on insulator (SOI) substrate, and a sapphire substrate.

11. The method according to claim 8, further comprises forming a second electrode on the first material layer, wherein the first and second electrodes are configured to receive a bias voltage for providing power to the light emitting layer to generate light.

12. The method according to claim 11, wherein the second electrode is formed at a surface area of the first material layer without the photonic nanostructures.

13. The method according to claim 12, wherein the first electrode comprises a combination of two or more elements selected from a group consisting of titanium, aluminium, nickel and gold, and the second electrode comprises a combination of two or more elements selected from a group consisting of nickel, gold, silver, and platinum.

14. The method according to claim 1, wherein the light emitting layer comprises one or more quantum wells of indium gallium nitride and gallium nitride (InGaN/GaN) heterostructures.

15. The method according to claim 1, wherein the first material layer comprises an n-type nitride material, and the second material layer comprises a p-type nitride material.

16. The method according to claim 15, wherein the first material is selected from a group consisting of an n-type GaN, an n-type AlGaN, an n-type InAlGaN, and the second material is selected from a group consisting of a p-type GaN, a p-type AlGaN, and a p-type InAlGaN.

17. The method according to claim 1, wherein the photonic nanostructures are generally pillar-type nanostructures.

* * * * *